US011346552B2

(12) United States Patent
Regueiro Fernandez et al.

(10) Patent No.: US 11,346,552 B2
(45) Date of Patent: May 31, 2022

(54) UNIVERSAL DEVICE FOR THE AUTOMATION OF GAS POWERED OVENS, BARBECUES AND DEVICES

(71) Applicant: BONELESS GRILLS SL, Barcelona (ES)

(72) Inventors: Marcos Regueiro Fernandez, Barcelona (ES); Alfredo Beltrain Ruiz, Barcelona (ES); Alfredo Beltran Rosa, Barcelona (ES); Ruben Campos Moral, Barcelona (ES)

(73) Assignee: BONELESS GRILLS SL, Barcelona (ES)

( * ) Notice: Subject to any disclaimer, the term of this patent is extended or adjusted under 35 U.S.C. 154(b) by 579 days.

(21) Appl. No.: 15/913,173

(22) Filed: Mar. 6, 2018

(65) Prior Publication Data

US 2019/0277498 A1  Sep. 12, 2019

(51) Int. Cl.
*F24C 3/12* (2006.01)
*F23N 1/00* (2006.01)
*H01R 27/02* (2006.01)
*H05K 5/00* (2006.01)
*A47J 37/07* (2006.01)
*A47J 37/06* (2006.01)

(52) U.S. Cl.
CPC .......... *F23N 1/002* (2013.01); *A47J 37/0664* (2013.01); *A47J 37/0786* (2013.01); *F24C 3/122* (2013.01); *H01R 27/02* (2013.01); *H05K 5/0017* (2013.01); *H05K 5/0069* (2013.01)

(58) Field of Classification Search
CPC ... A47J 37/0786; A47J 37/0664; F23N 1/002; F24C 3/122; H05K 5/0069; H05K 5/0017; H01R 27/02
See application file for complete search history.

(56) References Cited

U.S. PATENT DOCUMENTS

| 5,813,320 | A  | * | 9/1998  | Frasnetti   | F24C 3/126   |
|           |    |   |         |             | 126/39 G     |
| 5,813,394 | A  | * | 9/1998  | Clifford    | A47J 37/0713 |
|           |    |   |         |             | 126/39 BA    |
| 7,231,917 | B2 | * | 6/2007  | Frederiksen | A47J 37/0713 |
|           |    |   |         |             | 126/39 BA    |
| 7,287,551 | B2 | * | 10/2007 | James       | F16K 31/055  |
|           |    |   |         |             | 137/629      |
| 7,793,649 | B2 | * | 9/2010  | Barkhouse   | G05D 23/24   |
|           |    |   |         |             | 126/39 G     |
| 8,733,204 | B2 | * | 5/2014  | Voss        | A47J 37/0786 |
|           |    |   |         |             | 74/553       |
| 8,800,542 | B1 | * | 8/2014  | Kennington  | A47J 37/0786 |
|           |    |   |         |             | 126/25 B     |

(Continued)

*Primary Examiner* — Alfred Basichas
(74) *Attorney, Agent, or Firm* — Blue Filament Law PLLC

(57) ABSTRACT

A universal device for the automation of gas-powered ovens, barbecues and devices is provided that includes a variable gas intake valve housed in a module of a valve having means for valve coupling to a gas inlet hose of the oven, barbecue or device. An electronic board housed in a module of control is linked to the valve and drives the opening of the gas flow by means of an output signal supplied by the gas intake valve. The electronic board is provided with a connection with at least a probe of room temperature located within the chamber of the oven, barbecue, or device. The module of control includes control means and a power supply.

20 Claims, 3 Drawing Sheets

(56) References Cited

U.S. PATENT DOCUMENTS

| | | | | |
|---|---|---|---|---|
| 8,863,734 | B2* | 10/2014 | Shaffer | A47J 37/0713 |
| | | | | 126/39 BA |
| 9,289,096 | B2* | 3/2016 | Barkhouse | A47J 37/0713 |
| 9,329,606 | B2* | 5/2016 | Barkhouse | G05D 23/24 |
| 9,427,107 | B2* | 8/2016 | Reinhart | F24B 1/1895 |
| 9,585,400 | B2* | 3/2017 | Wiker | A21B 3/04 |
| 9,609,981 | B2* | 4/2017 | Schjerven, Sr. | A21B 1/245 |
| 10,021,887 | B2* | 7/2018 | McLemore | F23N 5/107 |
| 10,024,548 | B2* | 7/2018 | Wiker | A21B 1/48 |
| 10,036,558 | B2* | 7/2018 | Wiker | A21B 1/48 |
| 10,039,289 | B2* | 8/2018 | Wiker | A21B 3/04 |
| 10,180,691 | B2* | 1/2019 | Barkhouse | G05D 23/24 |
| 10,203,117 | B2* | 2/2019 | Moon | F23N 1/002 |
| 10,306,710 | B2* | 5/2019 | Lee | A47J 36/321 |
| 10,362,898 | B2* | 7/2019 | Schjerven, Sr. | A47J 37/044 |
| 10,485,379 | B2* | 11/2019 | Bennett | H05B 1/0266 |
| 10,584,875 | B2* | 3/2020 | Becker | F24C 3/122 |
| 10,591,166 | B2* | 3/2020 | Reinhart | F24C 15/32 |
| 10,677,663 | B2* | 6/2020 | Vishwakarma | B67D 7/3218 |
| 2005/0098169 | A1* | 5/2005 | Frederiksen | A47J 37/0713 |
| | | | | 126/41 R |
| 2007/0048683 | A1* | 3/2007 | Huff | F23N 5/02 |
| | | | | 431/281 |
| 2008/0038681 | A1* | 2/2008 | Huang | F23N 5/242 |
| | | | | 431/13 |
| 2008/0202351 | A1* | 8/2008 | Voss | A47J 37/0786 |
| | | | | 99/337 |
| 2009/0126714 | A1* | 5/2009 | Barkhouse | F23N 1/002 |
| | | | | 126/39 G |
| 2009/0183729 | A1* | 7/2009 | Barkhouse | A47J 36/321 |
| | | | | 126/39 BA |
| 2010/0132692 | A1* | 6/2010 | Shaffer | A47J 37/0713 |
| | | | | 126/39 E |
| 2010/0176323 | A1* | 7/2010 | Nguyen | F16K 27/003 |
| | | | | 251/129.15 |
| 2011/0048245 | A1* | 3/2011 | Schjerven, Sr. | A47J 37/045 |
| | | | | 99/331 |
| 2011/0088682 | A1* | 4/2011 | Barkhouse | F23N 1/002 |
| | | | | 126/39 G |
| 2011/0126820 | A1* | 6/2011 | Barkhouse | F23N 1/002 |
| | | | | 126/25 R |
| 2012/0167869 | A1* | 7/2012 | Huang | F24C 3/00 |
| | | | | 126/39 BA |
| 2013/0061765 | A1* | 3/2013 | Reinhart | F24C 15/2007 |
| | | | | 99/329 R |
| 2014/0174301 | A1* | 6/2014 | Moon | F23N 1/002 |
| | | | | 99/331 |
| 2015/0108380 | A1* | 4/2015 | Huang | F16K 37/00 |
| | | | | 251/129.04 |
| 2016/0334106 | A1* | 11/2016 | Reinhart | F24C 15/001 |
| 2016/0353756 | A1* | 12/2016 | McLemore | F23D 14/20 |
| 2017/0292711 | A1* | 10/2017 | Wang | F23N 1/005 |
| 2018/0008095 | A1* | 1/2018 | Bennett | A47J 37/0786 |
| 2018/0058690 | A1* | 3/2018 | Becker | F23N 5/102 |
| 2018/0084946 | A1* | 3/2018 | Gafford | A47J 37/0713 |
| 2019/0277505 | A1* | 9/2019 | Regueiro Fernandez | F24B 1/1895 |

* cited by examiner

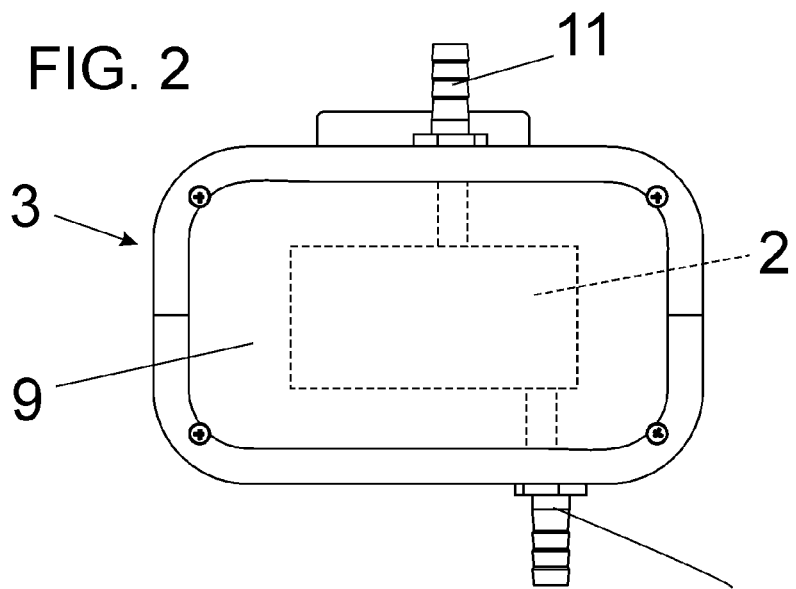
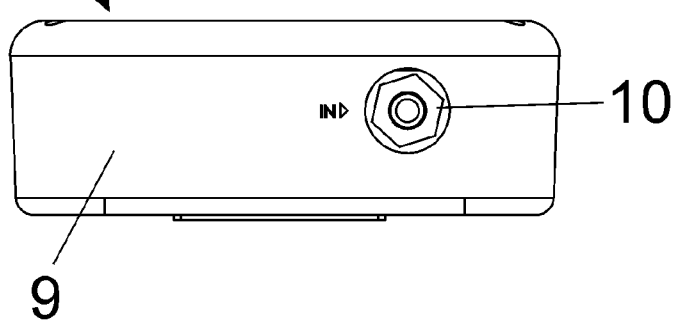
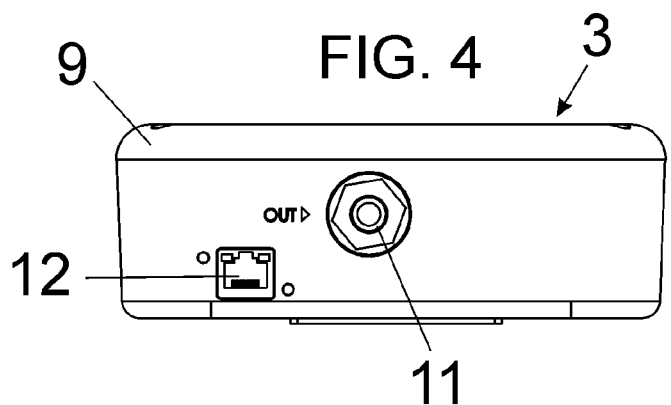

UNIVERSAL DEVICE FOR THE AUTOMATION OF GAS POWERED OVENS, BARBECUES AND DEVICES

OBJECT OF THE INVENTION

The invention, as stated in the title of this specification, refers to a universal device for the automation of gas-powered ovens, barbecues and devices that provides to the function to which it is designed, advantages and characteristics that are described in details below, which mean a significant novelty in the current state of the art.

The object of this invention refers to a universal device applicable to be incorporated in gas-powered barbecues, similar and derived ovens the aim of which is to allow to easily transform any conventional gas-powered oven or barbecue already existing in a fully automated device by regulating the flow of the gas supply, for which it comprises a gas valve that is intercalated in the gas inlet hose, housed in a module of valve that is driven by an electronic board with which it is connected and that, housed in a module of control, has available, at least a temperature probe situated within the oven chamber and the operation of which is controlled either from the module of control itself or remote by means of an app or web.

FIELD OF APPLICATION OF THE INVENTION

The field of application of this invention is within the sector of the industry engaged in the production of electronic devices, namely focussing in the scope of those applicable as control accessories for ovens, barbecues and devices using gas as fuel.

BACKGROUND OF THE INVENTION

As reference to the current state of the art, it shall be pointed out that, although in the market gas-powered barbecues are known that are already produced with a built-in automatic temperature regulator, at least the applicant is not aware of the existence of any universal device for the automation of already existing gas-powered barbecues and ovens being universal and adaptable to any already existing unit as well as of any other invention having a similar application showing technical and structural characteristics equal or similar to those the device herein claimed shows.

EXPLANATION OF THE INVENTION

The universal device for the automation of gas-powered ovens, barbecues and devices that the invention proposes is therefore configured as a significant novelty within its field of application, the characterizing details distinguishing it from the already known being conveniently included in the final claims attached to this description.

Concretely, the device that the invention proposes is a device comprising a variable gas intake valve, that can be a variable electrovalve: by means of electric pulses, voltage variation; or a motorized valve.

Anyway, the gas valve is driven by an electronic board that drives the opening of the gas flow by means of the output signal feeding the valve, the said control board having a temperature probe that is situated within the chamber.

The board has an interface for its control and selection of the parameters of temperature, cooking time, etc. that can be determined by analog buttons and a screen where the updated information of operation and the parameters selected are displayed, or by a touch screen displaying the same information as the aforesaid serving in addition as selecting keyboard, and it is also contemplated not to have any keyboard or screen and instead remote communication means to be handled by means of mobile devices, either by means of application or web. In addition, any of the two first options, as well the analog keyboard as the touch screen can be matched with the remote communication for mobile devices.

Preferably, the electronic board has also several connections for temperature probes designed to be poked in the foods to be cooked, to know their state during the cooking process. Also, the board plate has likewise, optionally, an internal battery that can be used in situations when the power supply is not available, as well as it can be connected to an external battery in its supplying connector to increase its range.

Anyway, and to make possible the incorporation of the components described in the oven to be controlled, the gas valve that is housed in a module of valve that, formed by a wrapping box, is provided with input and output connectors to allow their coupling intercalated in the gas inlet hose of the oven, as well as a connection port to connect the communication cable that links it to the electronic board.

On its hand, the electronic board is housed in the shell of a module of control that, in addition to a connection port for the opposite end of the cable of communication with the module of the valve and of a connector for the power cord allowing its connection to the network, it also contemplates several basis of connection, at least, a probe of the room temperature of the chamber and optionally, one or more additional ones for probes of the foods temperature as well as the incorporation of a battery.

Ultimately, the essential object of the invention is to provide a device for universal use allowing to fully automate the control of temperature of any existing device operating by means of gas burners such as gas-powered ovens, barbecues or devices.

Optionally, the said device has in addition a control of foods temperature to be able to check the cooking level and finishing point thereof and/or of remote connection to be remotely controlled by means of mobile devices and/or a power supply by battery to be used independently from the mains.

The described universal device for automation of gas-powered ovens, barbecues and devices consists therefore in an innovating structure having characteristics unknown up to now for the purpose to which it is designed, reasons that jointly with its practical utility, provide it with sufficient basis to obtain the privilege of exclusivity that is applied for.

DESCRIPTION OF THE DRAWINGS

To complement the description that is been done and in order to assist to a best understanding of the characteristics of the invention, are attached to this specification as an integral part thereof drawings in which for illustration and non-limiting purpose, the following has been represented:

The FIG. 1. It shows a view in perspective of a gas-powered barbecue in which an example of the universal device has been installed for the automation of gas-powered ovens, barbecues and devices, object of the invention, the main parts its comprises and their arrangement are seen;

Figure 6:
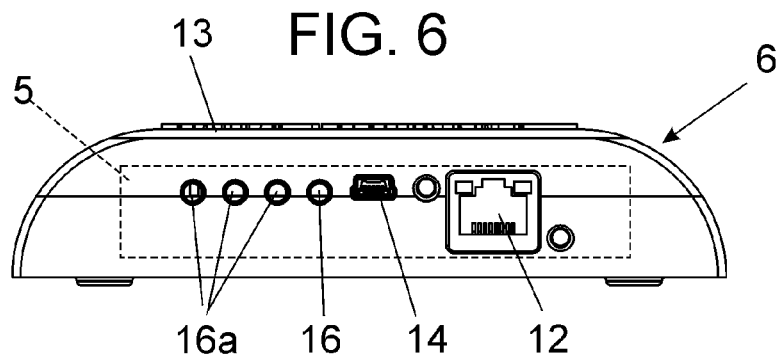
Figure 7:
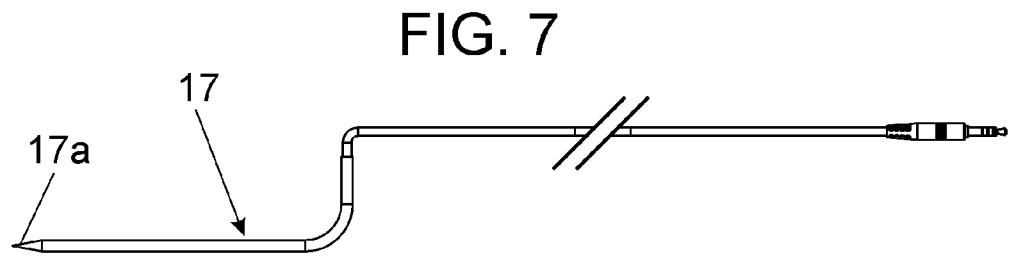
Figure 8:
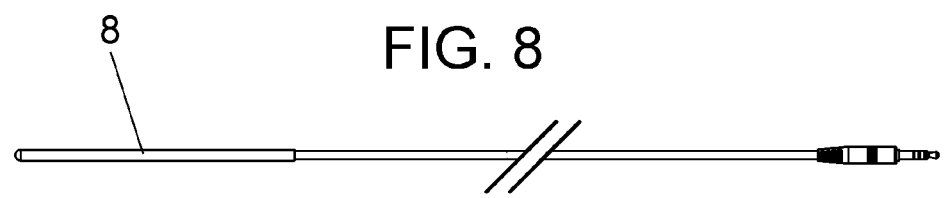
Figure 9:
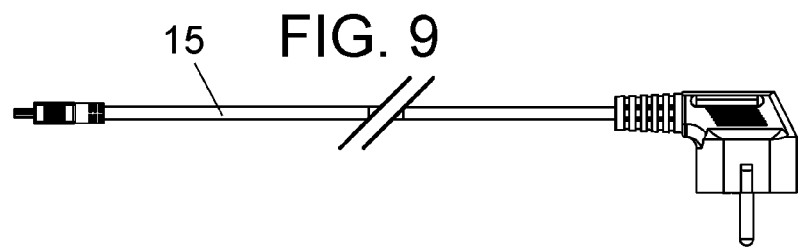

The FIGS. 2, 3, and 4. They respectively show plan and front and back elevation views of an example of module of valve that comprises the device of the invention, its general external configuration being seen;

The FIG. 5. It shows an elevation view of an example of cable of communication between modules;

The FIG. 6. It shows a side elevation view of an example of module of control of the device of the invention, its general external configuration and its main parts are seen;

The FIGS. 7 and 8. They show both cut side elevation views of the probe of foods temperature and of the probe of room temperature, respectively, that comprises the device, the configuration of both is seen;

The FIG. 9. It shows and elevation view of the power cord likewise cut, the module of control possesses for the connection to the mains; and The FIGS. 10 and 11. They show respectively both front and side elevation views of an example of a retaining clip for the probe of room temperature.

PREFERRED EMBODIMENT OF THE INVENTION

Seen the mentioned figures and in accordance with the numbering adopted, it can be observed in them a non-limiting example of embodiment of the universal device for the automation of gas-powered ovens, barbecues and devices of the invention, which comprises the parts and elements indicated and described in detail below.

Figure 1:
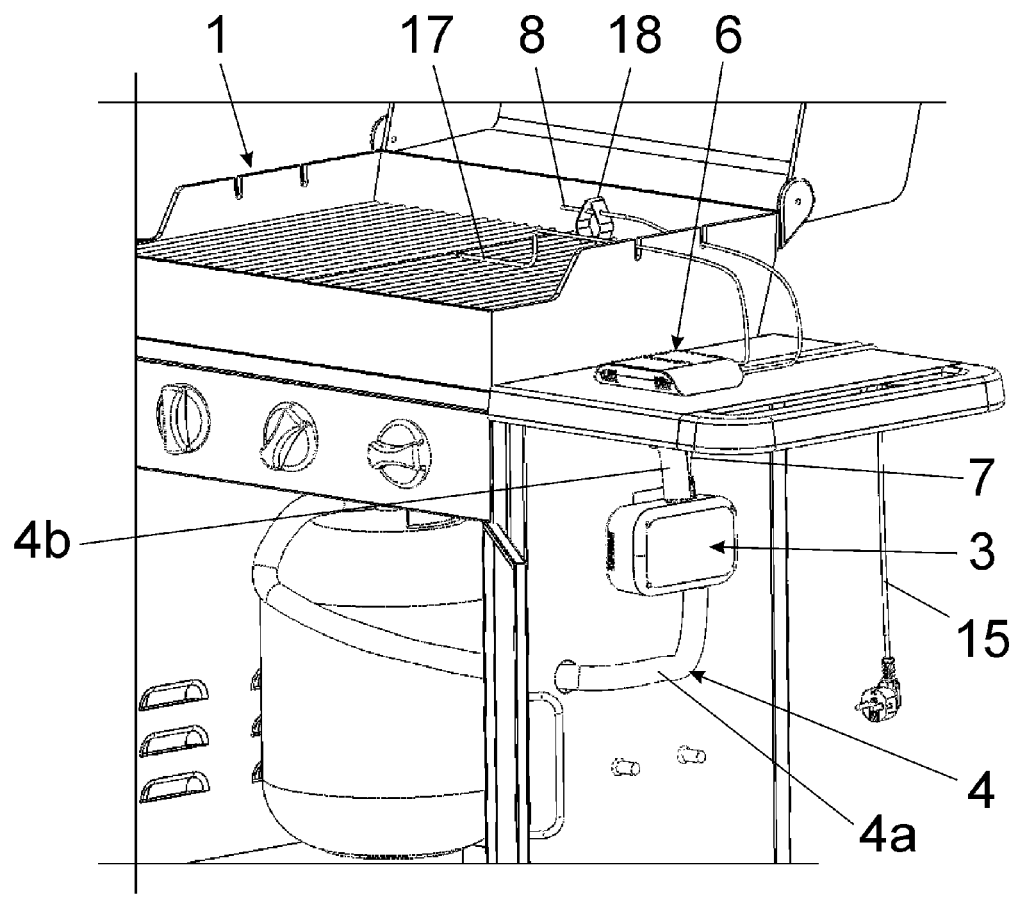

Thus, as it can be seen in the FIG. 1, the device of the invention, applicable for gas-powered ovens, barbecues (1) or devices, comprises a variable gas intake valve (2), housed in a module of valve (3) having means for its coupling intercalated in the gas inlet hose (4) of the oven (1) and an electronic board (5) housed in a module of control (6) that is connected to the valve (2) through a communication cable (7) and that drives the opening of the gas flow by means of the output signal that supply the said valve (2), the said electronic board (5) been provided with connection with at least one probe of room temperature (8) that can be located within the chamber.

The valve (2) housed in the module of the valve (3) is a variable electrovalve: by means of electric pulses, voltage variation or a motorized valve.

As it can be seen in FIGS. 1 to 4, in the preferred embodiment of the device, the module of valve (3) is formed by a wrapping box (9) provided with an input connector (10) (IN) and an output connector (11) (OUT) to allow their coupling intercalated in the gas inlet hose (4) of the oven, between respective lengths of input and output hose of the said module (3) as well as a connection port (12) to connect an end of the communication cable (7), shown in the FIG. 5, that links the valve (2) to the electronic board (5) of the module of control (6).

With reference to FIG. 6, it can be seen how the module of control (6) where the electronic board (5) is housed is constituted by a shell (13) that, in addition to a connection port (12) for the opposite end of the communication cable (7) and a connector (14) for the power cord (15) allowing its connection to the mains, also comprises, at least, a dock connector (16) to connect the probe of room temperature (8) the configuration of which can be seen in FIG. 8 and, optionally, one or more additional dock connectors (16a) to connect one or more foods temperature probe (17) that the device preferably also includes.

Figure 10:
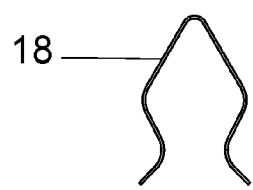
Figure 11:
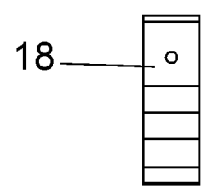

The said probe of room temperature (8), preferably, is fastened by a clip (18) as shown in the FIGS. 10 and 11, that allows to keep it in a lifted position on the grill in the chamber of the oven (1). The probe or probes of foods temperature (17), as shown in FIG. 7, have their end (17a) spike-shaped to be able to poke the foods.

In addition, preferably, the module of control (6) also incorporates a battery (not shown) as an alternative means of power supply when there is no possibility of connection to the mains.

Last, it shall be pointed out that, although it has not been represented in the figures, the module of control (6) shows as means for its control analog buttons and an information screen or a touch screen (this later serving as keyboard) or with means of remote control, by means of mobile devices, through an application or web, being the said remote control means, preferably, matched with any of the two preceding options.

With all this, for installing the device in the oven or barbecue (1) to be controlled, it is proceeded as follows:

The module of the valve (3) is intercalated in the hose (4) between both lengths (4a, 4b) in which it is divided for this, the input connector (10) (IN) remaining oriented towards the length of hose (4a) of the regulator of supply and the output connector (11) (OUT) oriented towards the length (4b) of the side of the burners. After the communication cable (7) is connected, connecting one end in the connection port (12) provided for it of the module of valve (3) and the other end in the connection port (12) of the module of control (6). Thereafter, it is proceeded to connect the probe of room temperature (8) to the dock connector (16) provided to that aim in the module of control itself (6) and the end of the said probe is placed within the area to be controlled, for example, in the cooking grill, using for that a fastening clip (18). Thereafter, the probes of foods temperature (17) that the client thinks he will need for this moment are connected to the additional dock connectors (16a) of the module of control (6). Last, the power cord (15) is connected to the connector (14) provided in the module of control (6).

After as well the module of control (6) as the module of valve (3) have been correctly installed, it can be proceeded to their use. For this, the mode ON will be selected in the module of control (6) or mobile device, as applicable, provoking that the valve (2) opens up to its maximum position, the passage of the gas remaining thus fully free to proceed to turn on the burners as it was carried out before its installation, when the burners with which it is wished to work are ON, the command of the ON burners are opened up to their position of maximum opening to let the gas passes fully free, selecting thereafter, in the module of control (6) or in our mobile device, as applicable, the temperature to which it is wished to work, being thus the module of valve (3) that controls the supply amount of gas to obtain the exact temperature according to the recorded by the probe of room temperature (8). When the cooking process is deemed finished, it is proceeded to turn off the burners as it was carried out before the installation of the controller, proceeding thereafter to turn off the device.

The nature of this invention being sufficiently described, as well as the way of implementing it, it is not deemed necessary to further extend its explanation in order that any man of the art comprises its extent and the advantages arising from it.

Also, it is pointed out that, within its essence, the invention can be implemented in other embodiments that differ in details from the one stated for example purpose and to which the protection sought extends provided that its main foundation is not altered, changed of modified.

The invention claimed is:

1. A universal device for the automation of gas-powered ovens or barbecues that comprises a variable gas intake valve (2) that is a variable electrovalve housed in a module of valve (3) the module of valve (3) configured to be coupled to a gas inlet hose (4) of the oven or barbecue (1) below a grill of a cooking chamber and external to the cooking chamber and an electronic board (5) housed in a module of control (6) linked to the valve (2) and that is configured to electrically operate the valve by electrical pulses, voltage variation, or a motor to control gas flow from the gas inlet hose (4) based on an output signal the module of control (6) supplies to the valve (2), the electronic board (5) being provided with connection with, at least, a cooking chamber temperature probe (8) fastened by a clip (18) and located within a cooking chamber of the oven or barbecue (1) the module of control (6) having a power supply (15), to fully automate the control of temperature of the oven or barbecue through the module of control (6) adjusting the module of valve (3) that controls the supply amount of gas to achieve a temperature according to the cooking chamber temperature probe (8) and to turn off the supply of gas and a burner when a cooking process at the achieved temperature is complete, wherein the passage of gas turns on the burner as carried out prior to installation of the universal device.

2. The universal device of claim 1, characterized in that the valve (2)-of the module of the valve (3) is operated by the electric pulses or voltage variation.

3. The universal device of claim 2, characterized in that the valve (2) of the module of the valve (3) has the motor and is a motorized valve.

4. The universal device of claim 3, characterized in that the module of the valve (3) is constituted by a wrapping box (9) provided with an input connector (10) (IN) and an output connector (11) (OUT) for coupling of the module of the valve (3) to the gas inlet hose (4) of the oven or barbecue, between respective input and output lengths of the said module (3), as well as a connection port (12) to connect an end of a communication cable (7).

5. The universal device for the automation of gas-powered ovens, barbecues and devices, according to the of claim 1, characterized in that the module of the valve (3) is constituted by a wrapping box (9) provided with an input connector (10) (IN) and an output connector (11) (OUT) for coupling of the module of the valve (3) to the gas inlet hose (4) of the oven or barbecue, between respective input and output lengths of the said module (3), as well as a connection port (12) to connect an end of a communication cable (7).

6. The universal device of claim 1, further comprising one or more probes of foods temperature (17) that can be connected to the electronic board (5).

7. The universal device of claim 1, characterized in that the module of control (6) is formed by a shell (13) that houses the electronic board (5) and having a connection port (12) for a communication cable (7), a dock connector (16) for the cooking chamber temperature probe (8) and, if applicable, one or more additional dock connectors (16a) for probes of foods temperature (17).

8. The universal device of claim 7, characterized in that the module of control (6) is controlled by analog buttons and an information screen or a touch screen.

9. The universal device of claim 7, characterized in that the control module (6) is controlled by a remote control or by mobile devices through an application or web.

10. The universal device of claim 7, characterized in that the control module (6) incorporates a battery as the power supply.

11. The universal device of claim 7, characterized in that the control module (6) incorporates a connector (14) for a power supply cable (15).

12. The universal device of claim 1, characterized in that the module of control (6) is controlled by analog buttons and an information screen or a touch screen.

13. The universal device of claim 12, characterized in that the control module (6) is controlled by a remote control or by mobile devices through an application or web.

14. The universal device of claim 12, characterized in that the control module (6) incorporates a battery as the power supply.

15. The universal device of claim 12, characterized in that the control module (6) incorporates a connector (14) for a power supply cable (15).

16. The universal device of claim 1, characterized in that the control module (6) is controlled by a remote control or by mobile devices through an application or web.

17. The universal device of claim 16, characterized in that the control module (6) incorporates a battery as the power supply.

18. The universal device of claim 1, characterized in that the control module (6) incorporates a battery as the power supply.

19. The universal device of claim 1, characterized in that the control module (6) incorporates a connector (14) for a power supply cable (15).

20. The universal device of claim 1, characterized in that the valve (2) is only a single valve.

* * * * *